United States Patent
Rocchi et al.

(10) Patent No.: US 6,622,106 B2
(45) Date of Patent: Sep. 16, 2003

(54) DEVICE FOR TESTING AND CALIBRATING THE OSCILLATION FREQUENCY OF AN INTEGRATED OSCILLATOR

(75) Inventors: Alessandro Rocchi, Rosignano Solvay (IT); Marco Bisio, Modena (IT); Guido De Sandre, Brugherio (IT); Giovanni Guaitini, Trecella (IT); Marco Pasotti, S. Martino Sicc. (IT); Pier Luigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 64 days.

(21) Appl. No.: 09/833,754

(22) Filed: Apr. 11, 2001

(65) Prior Publication Data

US 2001/0044702 A1 Nov. 22, 2001

(30) Foreign Application Priority Data

Apr. 13, 2000 (IT) ..................................... MI2000A0832

(51) Int. Cl.⁷ ................................................ H03B 5/00
(52) U.S. Cl. ......................... 702/107; 331/1 A; 326/93; 365/201; 375/354; 702/106
(58) Field of Search .......................... 702/85, 106, 107, 702/117; 331/1 A, 1 R, 2, 25, 109; 326/93; 365/201; 375/354

(56) References Cited

U.S. PATENT DOCUMENTS

| | | | |
|---|---|---|---|
| 5,382,922 A | * 1/1995 | Gersbach et al. | 331/1 A |
| 5,410,510 A | * 4/1995 | Smith et al. | 365/201 |
| 5,726,607 A | * 3/1998 | Brede et al. | 331/2 |
| 5,787,132 A | * 7/1998 | Kishigami et al. | 375/354 |
| 6,064,947 A | * 5/2000 | Sun et al. | 702/106 |
| 6,204,694 B1 | * 3/2001 | Sunter et al. | 326/93 |

* cited by examiner

*Primary Examiner*—John Barlow
*Assistant Examiner*—John Le
(74) *Attorney, Agent, or Firm*—Lisa K. Jorgenson; E. Russell Tarleton; SEED IP Law Group PLLC

(57) ABSTRACT

A digital device for testing and calibrating the oscillation frequency of an integrated oscillator circuit, the testing and calibrating device has as input at least first and second control parameters corresponding to limiting values of a predetermined range of values of the oscillation frequency sought for the integrated oscillator circuit, and it includes a comparison circuit for comparing a signal of known duration and a signal from the integrated oscillator circuit; a circuit connected to the comparison circuit, for generating calibration values for the signal from the integrated oscillator circuit; and a circuit for forcing storage of final calibration values of the signal from the integrated oscillator circuit into a storage and control section of the integrated oscillator circuit.

20 Claims, 3 Drawing Sheets

DEVICE FOR TESTING AND CALIBRATING THE OSCILLATION FREQUENCY OF AN INTEGRATED OSCILLATOR

TECHNICAL FIELD

The present invention relates to a device and method for testing and calibrating the oscillation frequency of an integrated oscillator.

BACKGROUND OF THE INVENTION

As is known, many devices formed on silicon currently include digital circuits. Additionally, in the instance of microprocessor and microcontroller chips, a digital part is incorporated in systems of various description, which usually include an analog part as well, to provide an effectual and flexible way of managing different sub-blocks in such systems.

With flash memories, for example, it may be necessary to perform decodings, operate charge pumps and regulators, and drive sense amplifiers and many other elements within the memories themselves, consistently with intended operations.

In such cases, the state of the art proposes implementing a state machine, i.e., a dedicated digital circuit operative to drive control signals within the integrated circuit or chip. In other cases, a microcontroller is incorporated in the chip to perform more complex operations than are allowed by a state machine, which microcontroller may be reconfigured as required.

However, for a digital type of control, a clock signal must be available to the chip which is usually supplied from without the chip, i.e., generated by external elements of the chip, typically quartz-containing elements.

In fact, a major advantage of quartz is that an oscillating signal can be generated at an accurately set frequency.

Thus, many prior solutions have been based on the use of a quartz oscillator circuit formed on a circuit board. Other solutions provide a quartz element connected directly to the chip pins.

In applications such as those affecting flash memories, the digital circuitry portion is arranged to operate essentially within the chip. Accordingly, the end user of the memory device will only be interested in the exchange of data with the memory, and he/she will produce signals relating to the operations in hand.

It is desirable, therefore, that an oscillator circuit be added to generate the clock signal within the chip. In this way, it also becomes possible to keep the number of the external components on the circuit board low, with favorable effects on space requirements and the cost of the finished devices.

However, technological tolerances of the integrated device fabricating process affect the accuracy of the oscillation frequency of an oscillator circuit integrated in a chip.

SUMMARY OF THE INVENTION

Embodiments of the present invention include a circuit integrated on a chip that is used in a preliminary chip testing stage to measure an oscillation frequency of a clock signal generated on the chip, and can also be used to calibrate the clock frequency to a particular specification.

The embodiments of the present invention provide a digital autotest device, integrated to a chip, which can measure and calibrate the frequency value of an oscillating signal generated within the chip, upon a signal of known duration being supplied from testing apparatus connected to said chip.

In accordance with one embodiment of the invention, a digital device for testing and calibrating the oscillation frequency of a semi-conductor integrated oscillator is provided. The device includes at least one storage and control section and a plurality of pins connected bi-directionally to the storage and control section, at least one of the input pins receiving a referencing signal of known duration, and having as input at least first and second testing valves. The device further includes a circuit for comparing the signal of known duration and the oscillation frequency signal; a circuit connected to the comparing circuit for generating calibration values from the signal of the integrated oscillator circuit; and a circuit for storing the final calibration values of the signal from the integrated oscillator circuit into the storage and control section.

In accordance with another embodiment of the invention, a testing and calibration system used in conjunction with a semi-conductor integrated oscillator is provided. The system includes a memory, a plurality of pads including first, second, third, and fourth pads; a referential generator adapted to be coupled to the first pad and configured to output a reference signal of known duration; and a testing and calibration circuit having first and second inputs to receive first and second testing values, a first output adapted to be coupled to the second pad for sending testing and calculation control signals, a second output adapted to be coupled to the third pad for sending frequency change signals, and a third input adapted to be coupled to the fourth pad for receiving a results signal.

In accordance with yet another embodiment of the invention, a method for the digital testing and calibration of an oscillation frequency generator in an integrated oscillator circuit is provided. The method includes starting the test and calibration operation; initiating the integrated oscillator circuit; setting a frequency selection signal to a nominal value; setting a counter of clock pulses to a zero starting value; initiating a reference signal of known duration generated by an internal generator; checking the level of the reference signal by means of an internal circuit of a testing and calibration device that is responsive to a change-over edge of the reference signal from a starting value; and incrementing the clock pulse counter and going back to the checking step. Ideally, the method includes after setting a frequency selection to a nominal value, sending first and second control parameters in digital form to the testing and calibrating device.

In accordance with another aspect of the foregoing method, additionally included are verifying that the value of the clock pulse counter lies within the range defined by the control parameters; altering the configuration of the frequency selectors associated with the internal configuration of the frequency selectors associated with the internal oscillator circuit, and going back to the step of setting a counter of clock pulses until the value of the internally generated oscillation frequency are within a predetermined frequency range corresponding to values between a minimum and a maximum; storing the resultant frequency selected values into a permanent storage element as the value of the internally generated oscillation frequency moves into the predetermined frequency range; and ending the test and calibration operation.

BRIEF DESCRIPTION OF THE DRAWINGS

The features and advantages of the testing and calibrating device according to the invention will be apparent from the following description of an embodiment thereof, given by way of non-limitative example with reference to the accompanying drawings, wherein.

DETAILED DESCRIPTION OF THE INVENTION

It is a known fact that the frequency of a periodic signal can be measured by counting the number of periods that occur in a given time interval, and dividing that number by the time interval.

Since any selected time interval may not encompass an integer number of periods, the period count may vary by plus or minus one period. This error can be obviated, however, by selecting a sufficiently long time interval for the count. Thus, for applications affecting flash memory devices, count time intervals upward of tens of MHz would be used, this being feasible with such applications.

Furthermore, ascertaining that a measured value of frequency does fall within a target range involves checking, against a given time base, that the number of pulses counted for the periodic signal is larger than a first reference number, corresponding to the lowest frequency value in the range, and smaller than a second reference number, corresponding to the highest frequency value in the range.

Figure 1:
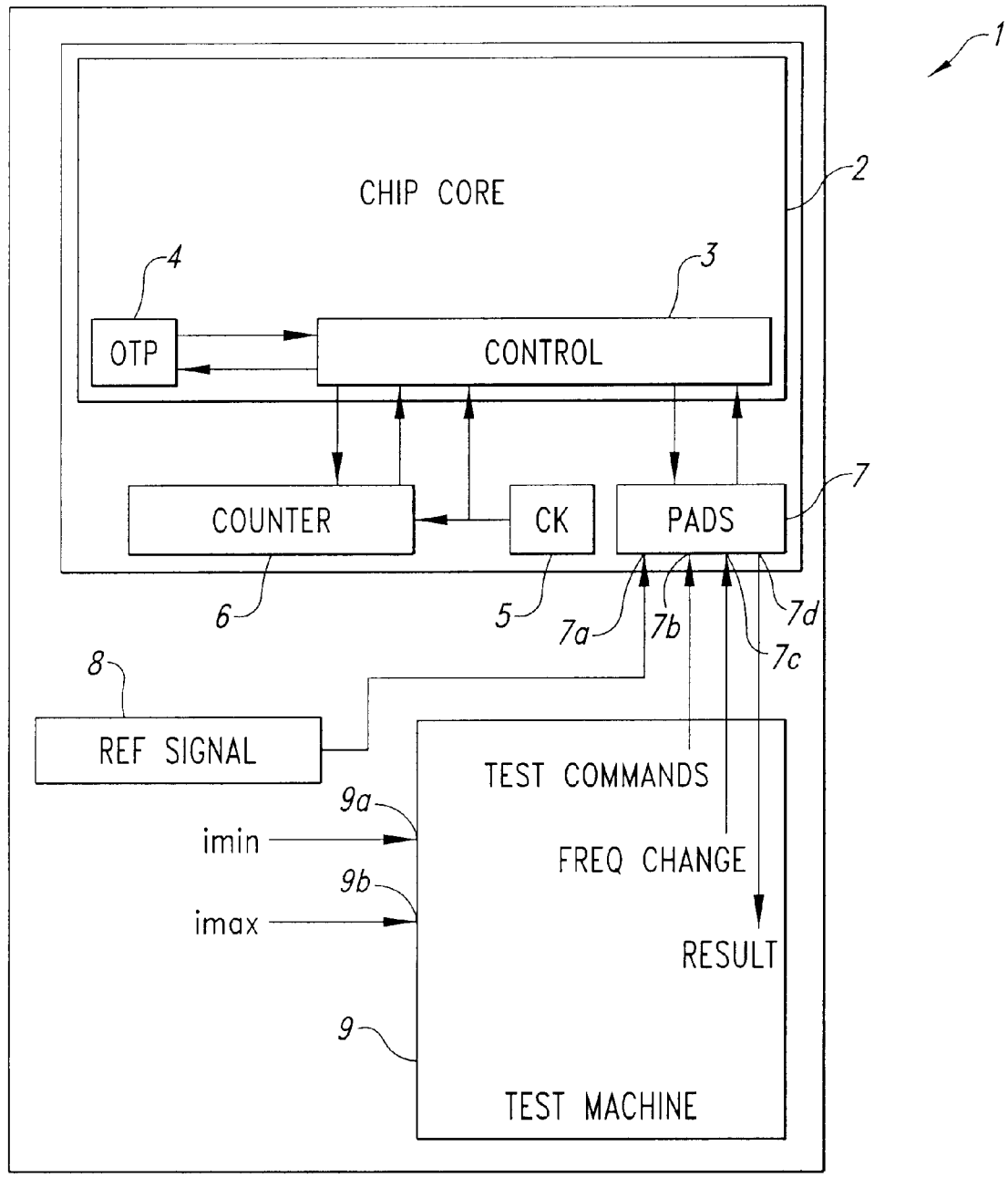
FIG. 1 shows schematically a first embodiment of a device for testing and calibrating the oscillation frequency of a clock signal generated by an integrated oscillator circuit according to the invention.

A first embodiment of a device for testing and calibrating a clock signal, which has been generated by an integrated oscillator according to the invention, is shown schematically in FIG. 1.

FIG. 1 shows schematically an integrated circuit or chip 1, which includes a storage and control section or "chip core" 2.

The chip core 2 comprises at least one control section 3 and a permanent storage element 4, connected together bidirectionally, with the storage element 4 being in particular an OTP (One Time Programmable) memory.

The chip 1 further includes an integrated oscillator circuit 5, referred to as the internal oscillator hereinafter, which is connected bidirectionally to the control section 3 and has the output connected to a counter 6, the latter being connected bidirectionally to the control section 3. Advantageously in this invention, the internal oscillator 5 has a programmable oscillation frequency, and the permanent storage element 4 will store up the resultant calibration values for that oscillation frequency.

It should be understood that an OTP memory element may be implemented in different ways. For example, a plurality of fuses may be used, which would be "blown" (or at least their connections would) by an appropriate voltage level to enable data to be stored permanently. Likewise, with EPROMs, EEPROMs, or flash memories, a portion of the memory array may be devoted to storing data on a permanent basis. Finally, where an integrated device is to be used in combination with an external non-volatile memory, a portion of the external memory may be used as the OTP storage element, so that no space is taken up within the integrated device.

The chip 1 has a plurality of connection pins, or pads, collectively designated 7, which are connected to an external reference signal generator 8. In particular, the external generator 8 will supply a reference signal of known duration for application to a first digital input pin 7a.

This plurality of connection pins 7 also comprise at least second 7b and third 7c digital input pins, and an output pin 7d, all adapted for connection to the testing and calibrating device 9 of the chip 1.

The testing and calibrating device 9 of the invention supplies control signals to the chip 1 through said digital input pins 7b and 7c, and reads result signals through said output pin 7d, to calibrate the oscillation frequency of the internal oscillator 5. In particular, the second digital input pin 7b receives appropriate signals TEST COMMANDS to initiate the chip testing step, and the third digital input pin 7c receives signals FREQ CHANGE to alter the oscillation frequency of the internal oscillator 5 consistently with a result signal RESULT read on the output pin 7d.

The testing device 9 also has first 9a and second 9b input terminals adapted to receive first imin and second imax control parameters, respectively, which correspond to the minimum and maximum oscillation frequency values to be obtained from the internal oscillator 5.

Figure 2:
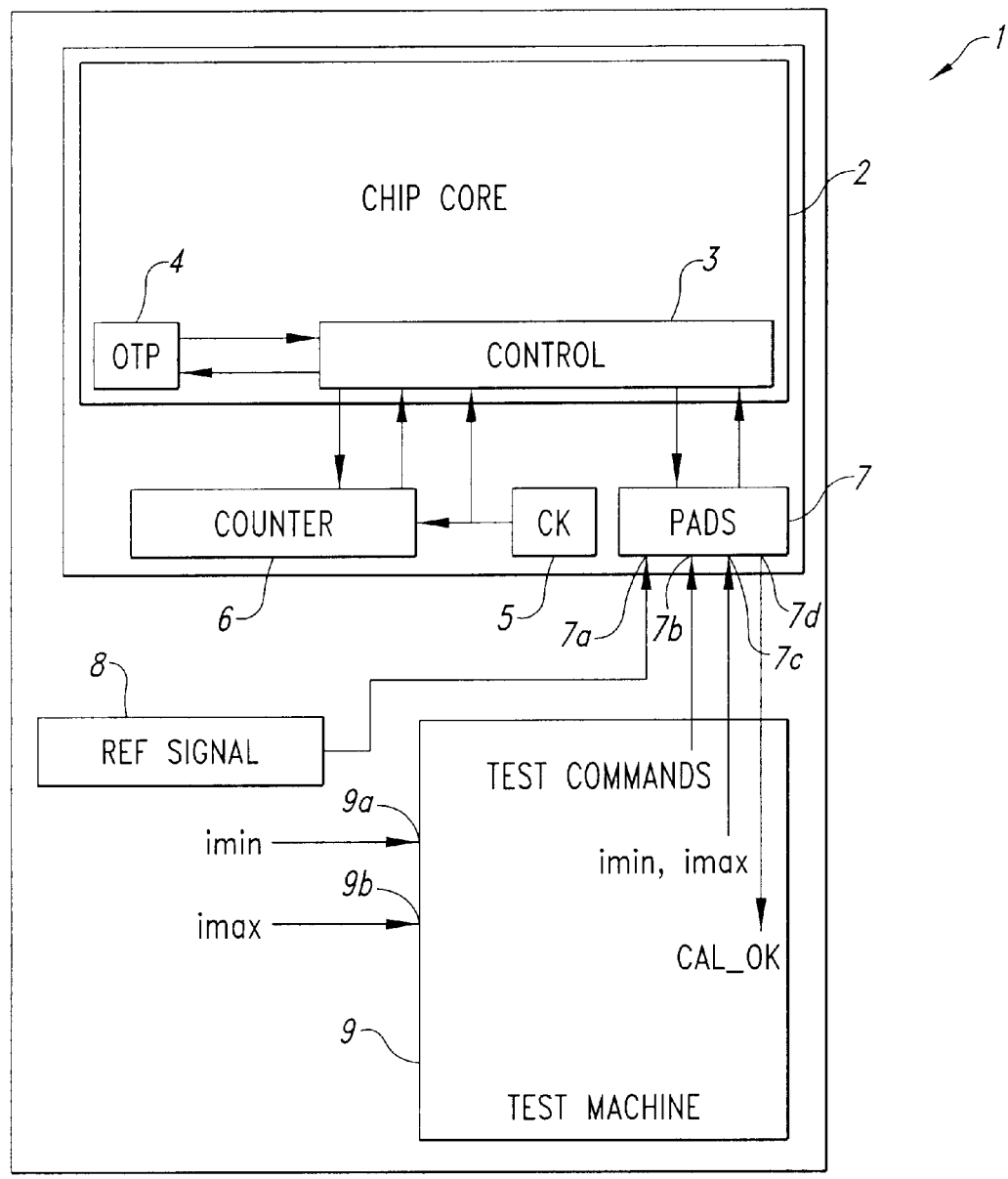
FIG. 2 shows schematically a second embodiment of a device for testing and calibrating the oscillation frequency of a clock signal generated by an integrated oscillator circuit according to the invention.

A second embodiment of a device for testing and calibrating the oscillation frequency of a clock signal generated by an integrated oscillator circuit according to the invention is shown schematically in FIG. 2. Similar elements are denoted by the same reference numerals for convenience of explanation.

In this case, the operation of testing and calibrating the oscillation frequency of the internal oscillator 5 is performed in a fully internal or "on-chip" mode, with all the signals used in the operation being internal of the testing and calibrating device 9.

In particular, the control parameters imin and imax are delivered directly to the third digital input pin 7c of the chip 1, and a calibration acknowledge signal CAL_OK is output on the output pin 7d.

It should be noted that the plural connection pins 7 are not additive to the standard pins of a chip, and that existing pins can be used, once re-configured by appropriate signals to enter a chip test mode.

Figure 3:
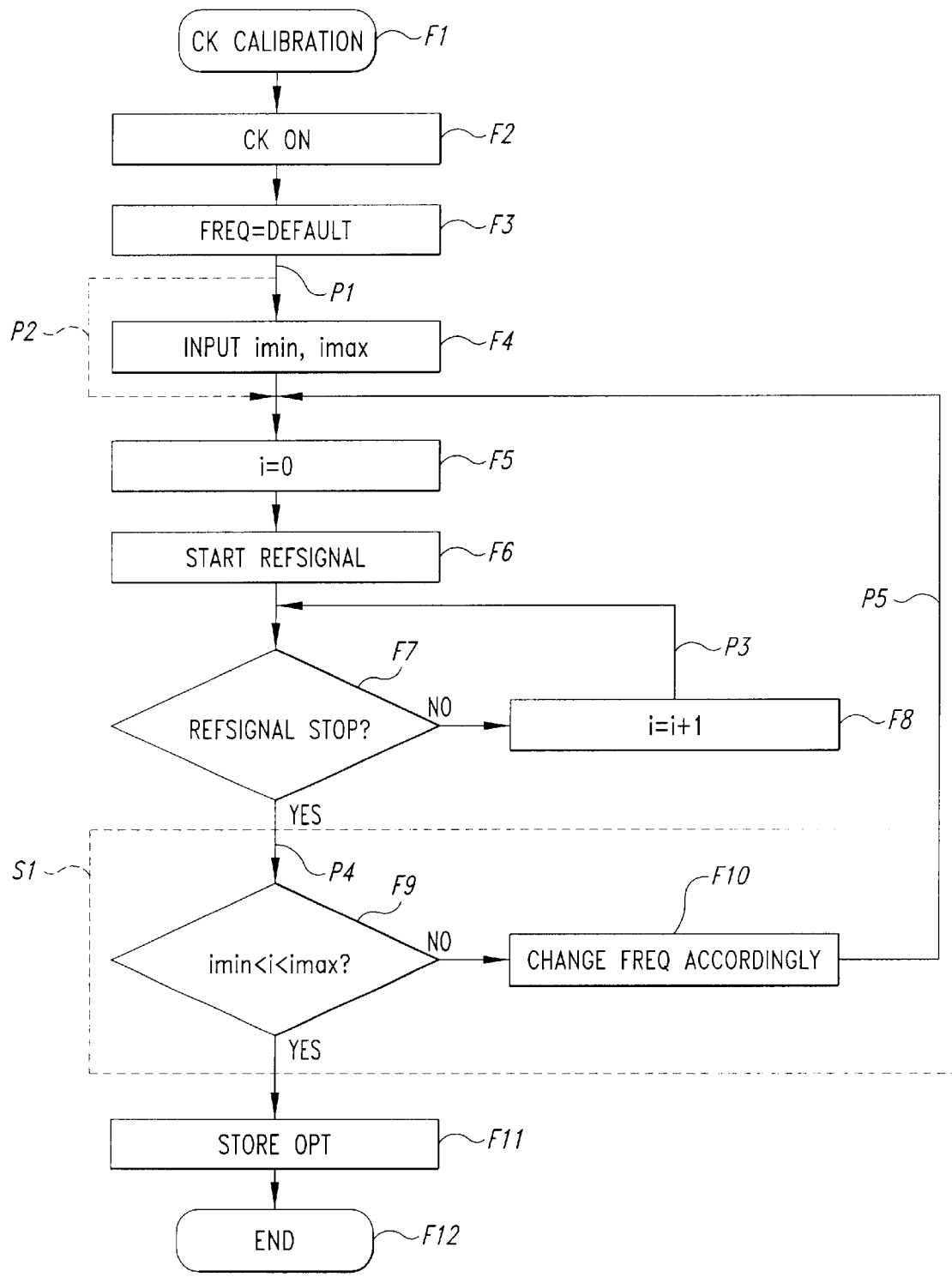
FIG. 3 is a flow chart illustrating the operation of the device for testing and calibrating the oscillation frequency of a clock signal generated by an integrated oscillator circuit according to the invention.

A test and calibration operation applied by the testing/calibrating device 9 is illustrated by the flow chart of FIG. 3. The operation comprises the following steps:

F1. starting the test and calibration operation;

F2. initiating the internal oscillator 5; and

F3. setting a frequency selection signal FREQ to a nominal value DEFAULT.

In the second embodiment of the chip according to the invention, to test and calibrate fully in the "on-chip" mode, the test and calibration operation is run on through a first path P1, as follows:

F4. sending the first and second control parameters, imin and imax, in digital form to the testing/calibrating device 9.

In the first embodiment of the chip according to the invention, shown in FIG. 1, step F4 is skipped, and the following steps are carried out directly through a second path P2:

F5. setting a counter of clock pulses to a zero starting value;

F6. initiating a reference signal REFSIGNAL of known duration;

F7. checking the level of the reference signal REFSIGNAL by means of an internal circuit of the testing/calibrating device 9 which is responsive to a changeover edge of the reference signal REFSIGNAL from a starting value; and F8. incrementing the clock pulse counter, and going back to the checking step F7 through a third path P3.

Upon the reference signal REFSIGNAL changing over from the starting level, the clock pulse counter is locked, and the test and calibration operation continued through a fourth path P4, as follows:

F9. verifying that the value of the clock pulse counter lies within the range extending between the control parameters imin and imax.

If the issue of the comparison is negative, that is if the value of the oscillation frequency generated internally falls outside the frequency range sought, corresponding to the values between imin and imax, the following is enacted:

F10. the configuration of the frequency selectors associated with the internal oscillator circuit is altered, and the procedure goes back to step F5 through a fifth path P5.

If the issue of the comparison is affirmative, that is if optimum values for the frequency selectors are found, the following final operations are completed:

F11. storing the frequency selector values found into the OTP permanent storage element 4; and F12. ending the test and calibration operation.

It should be noted that, whereas in the first embodiment of the chip according to the invention the clock pulse counter was checked by the testing/calibrating device 9, in the second embodiment, the check is carried out inside the chip core 2.

In other words, a section S1 of the test and calibration operation, including the steps of checking the oscillation frequency (F9) and changing the frequency selectors of the internal oscillator circuit (F10), is carried out "off-chip" in the first embodiment and "on-chip" in the second embodiment. In the latter case, the output signal will be the calibration acknowledge signal CAL_OK.

Although the end user of the chip is usually not interested in knowing the internal clock signal during normal operation of the chip, the user might intend to set the frequency of the internal clock, for a number of reasons, among which are the device performance and power consumption.

Accordingly, the integrated circuit, which incorporates the testing/calibrating device of this invention, may be modified to advantage by the provision of a set of external commands to enter the clock frequency testing and calibrating mode. For the purpose, it will suffice that the set of commands be specified in the data sheet of the chip, it being possible to add software means of speeding up the procedure, if desired.

In this case, the chip core would include a rewritable storage element, which may or may not have been factory-programmed in the course of a preliminary chip testing step, with the calibration technique used being specified in the chip data sheet as an added value to the integrated device features, since the oscillation frequency can be better controlled in this way.

To summarize, an integrated circuit or chip incorporating a testing/calibrating device according to the invention has the following advantages:

with the clock signal being generated internally or on-chip, the end integrated device incorporating the chip with the testing and calibrating device of the invention is made simpler for the external user; in addition, the space occupied on the circuit board, the number of components added, and the cost of the device can be reduced;

by including an oscillator circuit, which can be programmed and calibrated, a chip incorporating the testing/calibrating device of the invention is enabled to provide a clock value, which fills the application demands and compensates for the effects of technological variations on the frequency of an integrated oscillator circuit;

the testing/calibrating device 9 has no need of an external frequency meter, and it merely requires a generator to generate a signal of predetermined duration, the interfacing of the device to the chip being fully digital; in this way, the testing/calibrating device 9 can be simply implemented using general purpose processing systems, provided these include a communication interface;

the first embodiment of the chip incorporating the testing/calibrating device of the invention, shown in FIG. 1, has very simple internal circuitry but involves a more complicated setup of the testing step;

the second embodiment of the chip incorporating the testing/calibrating device of the invention, shown in FIG. 2, requires extended on-chip circuitry, but provides a much simpler testing/calibrating device.

In addition, since the calibration operation is managed in an indirect manner, a number of chips can be calibrated in parallel. In this case, the input signals should be the same to all chips, and can therefore be maintained in common. Upon attaining its optimum frequency, a chip will activate its signal CALC_OK, and enter a standby condition wherein the oscillation frequency is unchanged. Then, a reference signal keeps being proposed at regular intervals until the signals CALC_OK of all the chips under test acknowledge their calibrated states. It is only at this point that the operation of storing into the permanent storage element is completed, and the operations of testing and calibrating the chip plurality are brought to an end.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A digital device for testing and calibrating the oscillation frequency of a semiconductor integrated oscillator, the device comprising:

at least one storage and control section and a plurality of connection pins connected bidirectionally to said storage and control section, at least one of said input pins receiving a reference signal of known duration from a reference signal generator, and having as input at least first and second control parameters corresponding to limiting values of a predetermined range of values of the oscillation frequency sought for the integrated oscillator circuit;

means of comparing said signal of known duration and the oscillation frequency signal from said integrated oscillator circuit, said comparing means comprising a counter configured to count clock pulses for the duration of the reference signal;

means, connected to said compare means, of generating calibration values for the signal from said integrated oscillator circuit; and means of forcing storage of final calibration values of the signal from said integrated oscillator circuit into said storage and control section.

2. The digital testing and calibrating device of claim 1, configured to generate:

test signals to initiate the integrated circuit testing step that are supplied on a second pin of said plurality of connection pins;

change signals to change the oscillation frequency of the integrated oscillator circuit that are supplied on a third pin of said plurality of connection pins;

a result signal, corresponding to the measurement of the oscillation frequency of the integrated oscillator circuit, supplied on a fourth pin of said plurality of connection pins;

said change signals being a function of the result signal to provide a calibration of the oscillation frequency of the integrated oscillator circuit lying within said predetermined range of values.

3. The digital testing and calibrating device of claim 1, configured to generate:

signals to initiate integrated circuit testing that are supplied on a second pin of said plurality of connection pins;

said first and second control parameters, corresponding to limiting values of a predetermined range of values of the oscillation frequency sought for the integrated oscillator circuit, that are supplied on a third pin of said plurality of connection pins;

a calibration acknowledge signal that is received on a fourth pin of said plurality of connection pins; and said calibration acknowledge signal being generated by the integrated circuit consistently with its comparison with said first and second control parameters.

4. The digital testing and calibrating device of claim 1, wherein storage is forced of final calibration values of the signal from said integrated oscillator circuit into a permanent storage element contained in said storage and control section.

5. The digital testing and calibrating device of claim 4, wherein said means of generating calibration values for the signal from said integrated oscillator circuit comprises a control section connected bidirectionally to said permanent storage element and said plurality of connection pins.

6. The digital testing and calibrating device of claim 4, wherein said permanent storage element comprises a plurality of fuses adapted to be blown by an appropriate voltage to enable permanent storage of data.

7. The digital testing and calibrating device of claim 4, wherein said permanent storage element comprises a portion of a non-volatile memory array within the integrated circuit.

8. The digital testing and calibrating device of claim 4, wherein said permanent storage element comprises a portion of a non-volatile memory array without the integrated circuit.

9. The digital testing and calibrating device of claim 1, wherein said counter is connected bidirectionally to said integrated oscillator circuit and said means of generating calibration values for the signal from said integrated oscillator circuit.

10. The digital testing and calibrating device of claim 1, configured to provide a set of commands for entering the clock frequency testing and calibrating mode from outside.

11. A method of testing and calibrating an oscillation frequency of an integrated oscillator circuit in an integrated circuit, comprising:

starting the test and calibration operation;

initiating the integrated oscillator circuit;

setting a frequency selection signal to a nominal value;

setting a counter of clock pulses to a zero starting value;

initiating a reference signal of known duration generated by an internal generator;

checking the level of said reference signal by means of an internal circuit of a testing and calibrating device that is responsive to a change-over edge of said reference signal from a starting value;

incrementing the clock pulse counter, and going back to the checking step; and repeating the steps of checking and incrementing for the duration of the reference signal, and then locking the clock pulse counter.

12. The testing and calibrating method of claim 11, further comprising the following step between setting a frequency and setting a counter:

sending first and second control parameters in digital form to the testing and calibrating device.

13. The testing and calibrating method of claim 11, further comprising the following step, carried out upon the reference signal of changing over from the starting level, and the clock pulse counter becoming locked:

verifying that the value of the clock pulse counter lies within the range defined by the control parameters imin, imax;

altering the configuration of the frequency selectors associated with the internal oscillator circuit, and going back to setting the counter of clock pulses to a zero starting value until the value of the internally generated oscillation frequency lies within a predetermined frequency range corresponding to values between imin and imax;

storing the resultant frequency selector values into a permanent storage element, as the value of the internally generated oscillation frequency moves into the predetermined frequency range; and ending the test and calibration operation.

14. The procedure for calibrating a plurality of integrated circuits according to claim 13, comprising:

sending common input signals to said plurality of integrated circuits;

activating the respective calibration acknowledge signals, and entering a standby mode whereby the oscillation frequency is changed for none of the integrated circuits in said plurality, once an optimum oscillation frequency of the respective integrated oscillator circuit is achieved;

storing up the clamped frequency values upon all the calibration acknowledge signals of said plurality of integrated circuits acknowledging their calibrated state; and terminating the calibration procedure.

15. A testing and calibration system for use in conjunction with a semiconductor integrated oscillator having a memory and a control circuit, comprising:

a plurality of connection members, including first, second, third and fourth connection members associated with the memory and the control circuit;

a reference signal generator coupled to the first connection member and configured to output a reference signal of known duration;

a counter of clock pulses connected bidirectionally to the integrated oscillator circuit and to the control circuit and configured to count the clock pulses for the duration of the reference signal; and a testing and calibration circuit having first and second inputs to receive first and second testing values, a first output adapted to be coupled to the second connection member for sending testing and calibration control signals to the control circuit; a second output coupled to the third connection member for sending frequency change signals to the control circuit, and a third input coupled to the fourth connection member for receiving a result signal from the control circuit.

16. The system of claim 15, wherein the testing and calibration circuit is configured to compare a reference signal of known duration generated by the reference signal generator with an oscillation frequency signal from the semiconductor integrated oscillator, to generate a frequency change signal in response to the comparison of the reference signal and the oscillation frequency signal, and to initiate storage of a final value of the oscillation frequency signal in the memory.

17. The system of claim 16, wherein the testing and calibration circuit are configured to maintain the oscillation frequency signal within a range established by the first and second testing values.

18. A testing and calibration system for use in conjunction with a semiconductor integrated oscillator, comprising:

a memory and a control circuit coupled to the memory;

a plurality of connection members, including first, second, third and fourth connection members association with the control circuit;

a reference signal generator coupled to the first connection member and configured to output a reference signal of known duration;

a counter of clock pulses connected bidirectionally to the integrated oscillator circuit and to the control circuit and configured to count the clock pulses for the duration of the reference signal; and a testing and calibration circuit having first and second inputs to receive a minimum and maximum testing value, respectively, a first output coupled to the second connection member for sending testing and calibration control signals; a second output coupled to the third connection member for sending the minimum and maximum testing values, and a third input coupled to the fourth connection member for receiving a result signal.

19. The system of claim 18, wherein the testing and calibration circuit is configured to compare the reference signal of known duration with an oscillation frequency signal from the semiconductor integrated oscillator, to generate a frequency change signal in response to the comparison of the reference signal and the oscillation frequency signal, and to initiate storage of the final value of the oscillation frequency signal in the memory.

20. The system of claim 19, wherein the testing and calibration circuit is configured to maintain the oscillation frequency within a range established by the minimum and maximum testing values.

* * * * *